United States Patent [19]

Schimpe

[11] Patent Number: 4,897,844
[45] Date of Patent: Jan. 30, 1990

[54] INFORMATION TRANSMISSION BY MODE MODULATION AND LASER OSCILLATORS THEREOF

[76] Inventor: Robert M. Schimpe, Georg-Kerschensteiner strasse 56, D-8012 Ottobrunn/Riemerling, Fed. Rep. of Germany

[21] Appl. No.: 323,270

[22] Filed: Mar. 15, 1989

Related U.S. Application Data

[63] Continuation of Ser. No. 32,298, Mar. 30, 1987, abandoned.

[30] Foreign Application Priority Data

Apr. 3, 1986 [DE] Fed. Rep. of Germany ....... 3611182
Dec. 27, 1986 [EP] European Pat. Off. ........ 86118086.7

[51] Int. Cl.⁴ ............................................. H01S 3/10
[52] U.S. Cl. ...................... 372/26; 372/45; 372/96; 372/102
[58] Field of Search ...................... 372/26, 45, 96, 102; 332/7.51; 455/609

[56] References Cited

U.S. PATENT DOCUMENTS 4,217,561  8/1980  Scitres et al. .......................... 372/50

FOREIGN PATENT DOCUMENTS 0138087  8/1983  Japan ..................................... 372/96
0186083  9/1985  Japan ..................................... 372/96

OTHER PUBLICATIONS

Uchiyama et al., "GaInAsP/InP Surface Emitting Laser with Current Containing Structure," J. Lightwave Technoli, LT-4, pp. 846-851, 1986.
Liau et al., "Surface-Emitting GaInAsP/InP Laser with Low Threshold Current and High Efficiency", Appl. Phys. Lett., 46, pp. 115-117, 1985.
Wang et al., "Analysis of Ring Distributed Feedback Lasers," Journal of Appl. Phys., vol. 45, No. 9, Sep. 1974, pp. 3978-3980.
Reinhart et al., "Integrated Electro-Optic Intracavity Frequency Modulation of Double-Heterostructure Injection Laser", Appl. Phys. Lett., 27, pp. 532-534, 1975.
Arakawa et al., "Active Q-Switching in a GaAs/AyGaAs Multiquantum Well Laser with an Intracavity Monolythic Loss Modulator", Appl. Phys. Lett., 48, pp. 561-563, 1986.
Reinhart et al., "Electro-Optic Frequency- and Polarization Modulated Injection Laser", Appl. Phys. Lett., 36, pp. 954-957, 1980.
W. T. Tsang, "Enhanced Frequency Modulation in Cleared-Coupled-Cavity Semiconductor Lasers with Reduced Spurious Intensity Modulation," Appl. Phys. Lett., 43(6), Sep. 15, 1963, pp. 527-529.

*Primary Examiner*—William L. Sikes
*Assistant Examiner*—Georgia Y. Epps
*Attorney, Agent, or Firm*—Karl F. Milde, Jr.

[57] ABSTRACT

Apparatus for the transmission of information by a laser beam and laser oscillators therefore are disclosed. This apparatus includes at least one laser oscillator for generating a laser beam and means associated with the laser oscillator for varying a characteristical quantity of the laser beam. The laser may take the form of a surface-emitting semiconductor laser, in which case the variable quantity is the spatial mode content of the laser beam. The laser may be provided with externally controllable means for extracting wave energy from a laser wave in the resonator of the laser, in which case the varying quantity is the spatial mode content or the frequency of the laser beam.

30 Claims, 22 Drawing Sheets

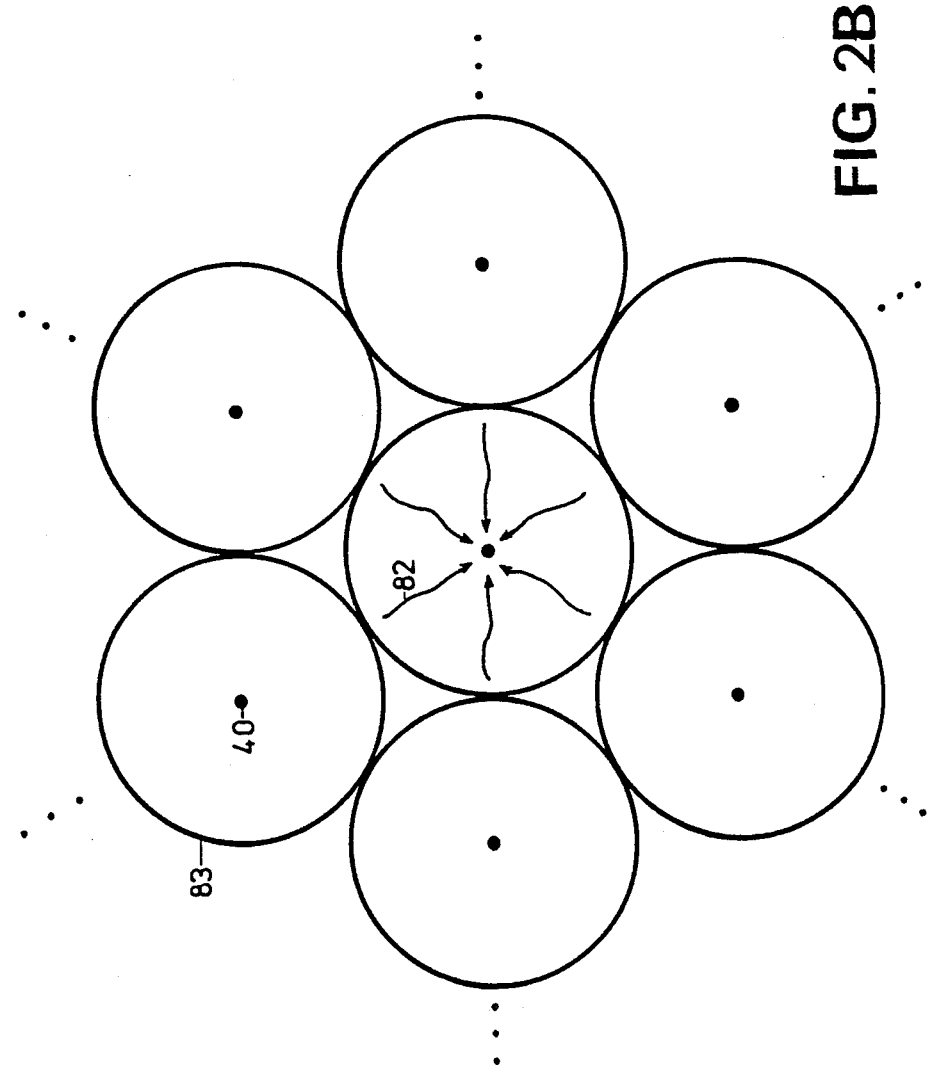

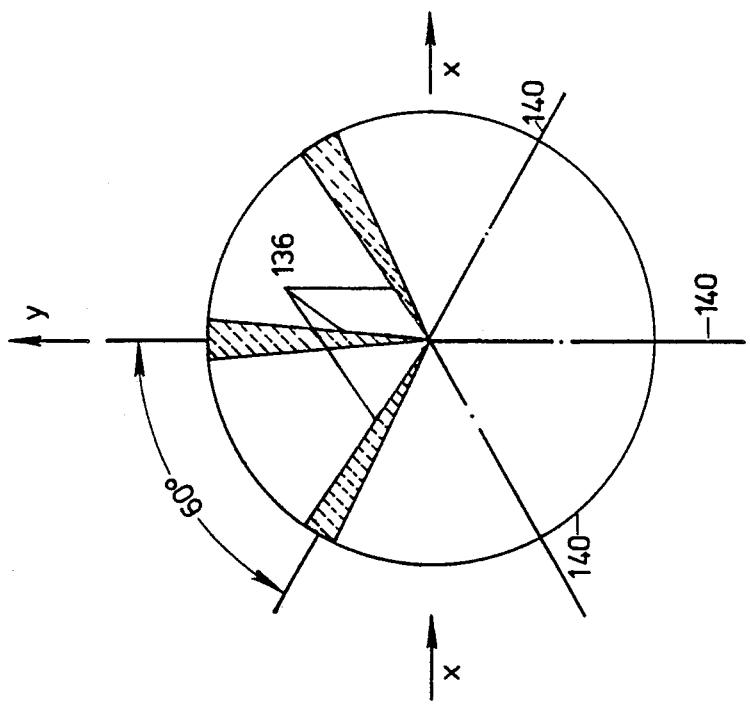
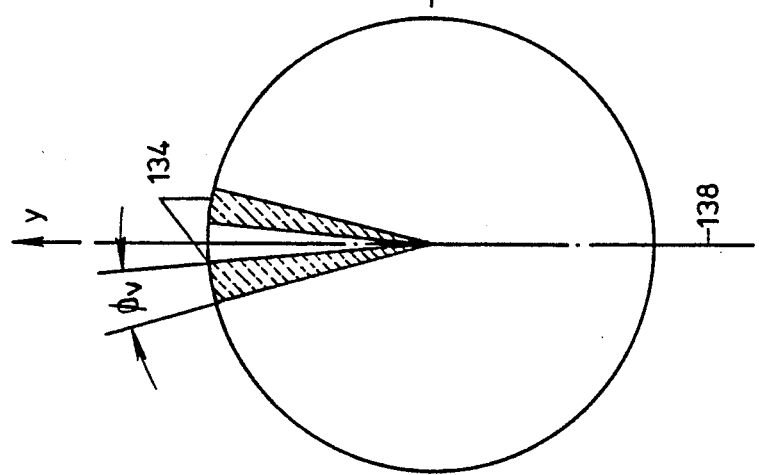
FIG. 6A
FIG. 6B

INFORMATION TRANSMISSION BY MODE MODULATION AND LASER OSCILLATORS THEREOF

This application is a continuation, of application Ser. No. 032,298, filed Mar. 30, 1987 now abandoned.

BACKGROUND OF THE INVENTION

1. Field of the Invention

The present invention relates to apparatus (devices) for the transmission of information by a laser beam and laser oscillators therefore. This apparatus includes at least one laser oscillator for generating a laser beam and means for varying a characteristical quantity of the laser beam. The laser may take the form of a surface-emitting semiconductor laser, in which case the variable quantity is the spatial mode content of the laser beam. The laser may be provided with electrically variable means for extracting wave energy from a laser wave in the resonator of the laser, in which case the varying quantity is the spatial mode content or the frequency of the laser beam.

2. Description of the Prior Art

An information transmission system is the ensemble of components, which contribute to the transmission of information from an emitter to a receiver. The information is transmitted by the modulation of a characteristical quantity of the carrier wave by a signal wave, which has to be transmitted by means of this carrier wave from an emitter to one or several receivers. The modulation may be created by variations of the intensity of the carrier wave or of the phase angle of the carrier wave. For example, if the intensity of the carrier wave is emitted by pulses, which are controlled in some aspect by the signal wave, pulse modulation takes place. If the frequency of the carrier wave follows in some aspect the signal wave, frequency modulation takes place. If the phase change of the carrier wave obeys in some aspect the signal wave, phase modulation takes place.

A carrier wave and particularly a laser beam is characterized by its intensity and phase angle, as described above, and by its spatial mode content. The spatial mode content of a laser beam is characterized for example by the field distribution in a plane perpendicular to the directions of propagation of the beam, which means that the spatial mode content of a laser beam is characterized by the curvature of a phase front of the laser beam and by the spatial intensity distribution in the plane of such a phase front.

A large variety of oscillators with means for the variation of the oscillator wave are known, particularly optical lasers. Typical of this large body of prior art are the following references:

(1) Y. Arakawa et al., "Active Q switching in a GaAs-/AlGaAs multiquantum well laser with an intracavity monolythic loss modulator", Appl. Phys. Lett. 48, pp. 561-563, 1986.

(2) F. K. Reinhart et al., "Integrated electro-optic intracavity frequency modulation of double-heterostructure injection laser", Appl. Phys. Lett. 27, pp. 532-534, 1975.

(3) F. K. Reinhart et al., "Electro-optic frequency- and polarization-modulated injection laser", Appl. Phys. Lett. 36, pp. 954-957, 1980.

(4) S. Uchiyama et al., "GaInAsP/InP Surface-Emitting Lasers with Current Confining Structure", J. Lightwave Technol. LT-4, pp. 846-851, 1986.

(5) Z. L. Liau et al., "Surface-emitting GaInAsP/InP laser with low threshold current and high efficiency", Appl. Phys Lett. 46, pp. 115-117, 1985.

(6) R. Schimpe, "Cylindrical diffraction grating couplers and distributed feedback resonators for guided wave devices", U.S. patent application Ser. No. 06/814,612, 1985.

In Ref. 1, the arrangement of externally controllable absorption structures in optical laser resonators is used for switching of the intensity of a laser wave generated in the resonator. In Ref. 2, the change of the refractive index due to an electric field is used for frequency modulation. In Ref. 3, the wavelength shift of the maximum of the optical amplification over several longitudinal modes is used for tuning of the laser wavelength. In the Refs. 4 and 5, surface-emitting semiconductor lasers are described, which are characterized by the emission of the laser output beam essentially perpendicular to the substrate on which an active region of the semiconductor laser is grown. In Ref. 6, a surface-emitting semiconductor laser generating a laser beam with definite mode content is described by providing means for the selection of the mode content of this laser beam.

It is not known, however, to arrange electrically variable means for extracting energy from a laser wave within the resonator of a laser, with the aim to generate a laser beam with varying spatial mode content, whereas the intensity and the frequency of the laser beam are essentially constant (hereafter referred to as "mode modulation"). It is not known to operate an apparatus of the above mentioned type with the aim to generate a laser beam with varying frequency, whereas the intensity and the spatial mode content of the laser beam are essentially constant. It is also not known to provide a surface-emitting semiconductor laser with electrically variable means for selecting the spatial mode content of the laser beam. Furthermore, it is not known to have an information transmission system, wherein the information is transmitted essentially by a modulation of the spatial mode content of a laser beam.

SUMMARY OF THE INVENTION

It is an object of the present invention to provide apparatus for controlling waves which includes at least one laser oscillator for generating a laser beam and means for varying a characteristical quantity of the laser beam. The varied quantity of the laser beam may be the spatial mode content of the laser beam or the frequency of the laser beam.

It is a further object of the present invention to provide apparatus of the above-noted type in which the laser serves as emitter in an information transmission system.

These objects, as well as further objects which will become apparent from the discussion that follows, are achieved, according to the present invention, by providing a laser with means for varying a characteristical quantity of the laser beam.

More particularly, the apparatus for the generation of a varying laser beam includes a resonator and includes means for the generation of a laser wave within this resonator. Further included are electrically variable means for extracting energy from the laser wave. The spatial distribution of the energy extraction efficiency within the resonator is varied such that the intensity of the laser beam is essentially undisturbed. The varied quantity of the laser beam is the spatial mode content of the laser beam. Alternatively, the varied quantity of the laser beam is the frequency of the laser beam.

The apparatus for the generation of a laser beam with variable spatial mode content comprises a semiconductor laser having its laser beam emitted essentially perpendicular to the substrate on which the active region of the semiconductor laser is deposited. Means for selecting the spatial mode content of the laser beam is provided, which is variable electrically.

The apparatus for transmitting information by a laser beam includes a laser and includes means for modulating the laser beam with the information. Means for the detection of the information is provided as well as means for the transmission of the modulated laser beam from the laser to the means for the detection. The information is transmitted essentially by a modulation of the spatial mode content of the laser beam.

As used throughout this specification the term "means for the exchange of wave energy" is employed as a superimposed concept for means for adding of wave energy or means for extracting of wave energy. Adding of wave energy occurs for example by propagating a wave through a medium with gain. Extracting of wave energy may occur, if a wave propagates through an absorptive medium or through a waveguide provided with a diffraction grating.

For a full understanding of the present invention, reference should now be made to the following detailed description of the theoretical underpinnings as well as the preferred embodiments of the invention, as well as to the accompanying drawings. Further preferred embodiments are the subject matter of further depending claims.

BRIEF DESCRIPTION OF THE DRAWINGS

FIG. 2B shows a plan view of a two-dimensional matrix of devices according to FIG. 2A.

FIG. 6A and FIG. 6B show schematically sector shaped absorption structures for the control or detection of the spatial distribution of the wave energy.

DESCRIPTION OF THE PREFERRED EMBODIMENTS

Figure 1A:
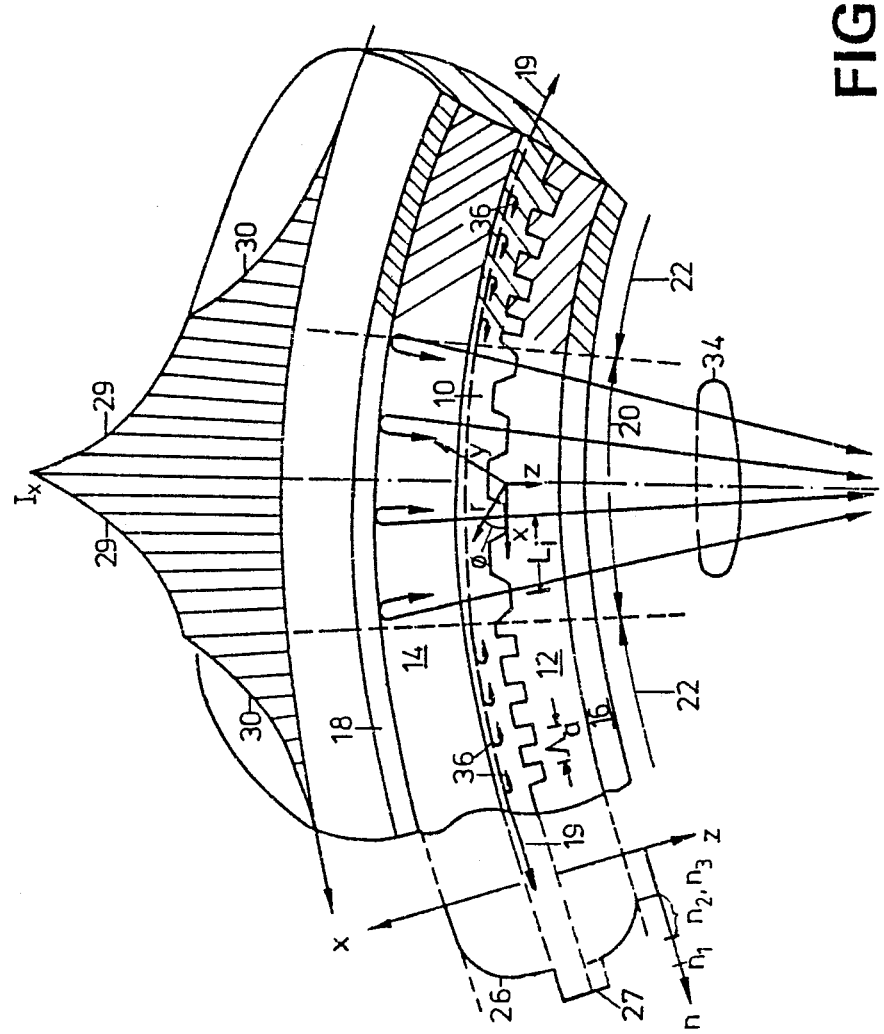
FIG. 1A is a cross-sectional and partly representational diagram of a generalized "sandwich"-type or thin film waveguide, having a diffraction grating according to the invention, for controlling electromagnetic waves.

Both the theoretical background as well exemplary applications of the present invention will now be described with reference to FIGS. 1-17 of the drawings. Identical elements in the various figures are designated by the same reference numerals.

Figure 1B:
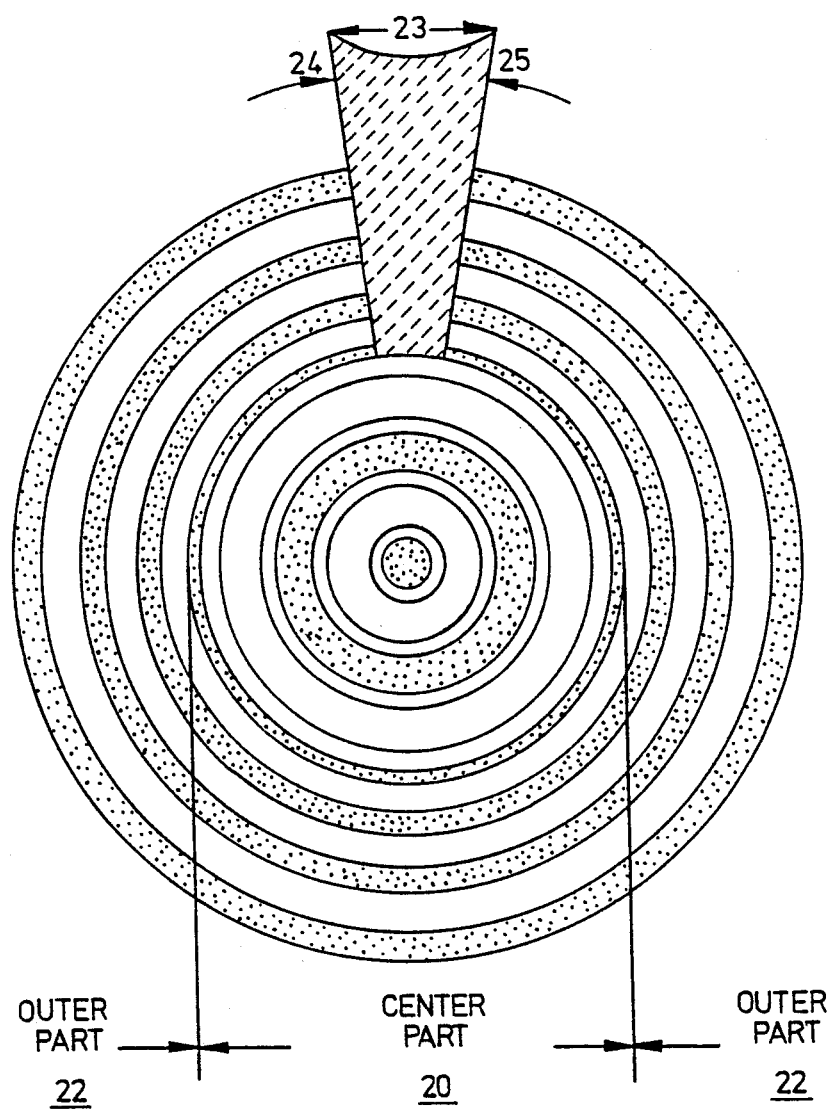
FIG. 1B is a plan view of the diffraction grating employed in the device of FIG. 1A.

The FIGS. 1A and 1B illustrate a waveguide of curviplanar shape, which is provided with a cylindrical diffraction grating. For illustrative purposes, the discussion is restricted to circular cylindrical diffraction gratings. In these diagrams, the x, y and z Cartesian coordinates and the r and $\phi$ polar coordinates are indicated to provide orientation. The waveguide of FIGS. 1A and 1B has a "sandwich" structure which is slightly curved (i.e. spherical) in the x-y direction.

In FIG. 1A there is shown a cross-section of the sandwich structure comprising a central wave transmitting layer 10, two wave transmitting "cladding" layers 12 and 14, an anti-reflection layer 16 and a reflective or mirror layer 18.

The index of refraction $n_1$ of the central layer is higher than the indices of refraction $n_2$, $n_3$ of the cladding layers 12 and 14, respectively. The central and cladding layers thus serve as a waveguide for electromagnetic radiation (EMR) in the infrared, visible light or ultraviolet light spectra. The transmission of such radiation along the waveguide is indicated by the arrows 19.

The boundary between the central layer 10 and the cladding layer 12 includes a plurality of substantially closed loop ridges and grooves which form a cylindrical diffraction grating for guided waves.

FIG. 1B shows the diffraction grating in plan view, with the bottoms of the grooves (i.e., the surfaces of the cladding layer 12 facing the central layer 10 which are closest to the cladding layer 14) indicated in solid black. As may be seen, the grooves are substantially circular and coaxial; i.e., they successively enclose each other from the innermost groove outward.

As may be seen in both FIG. 1A and FIG. 1B, the diffraction grating is divided into two parts: a center part 20 and a surrounding, outer part 22. The radial distance $n_a$ of successive ridges of the outer part is half as large as the radial distance $n_i$ in the inner part. The radial width of the ridges and the radial width of the grooves is equal, in the inner part as well as in the outer part. It can be seen in FIG. 1B that the grating lines of the outer part 22 are interrupted in a sector shaped region 23, which means that the region 23 is uncorrugated. The region 23 is bounded by two lines 24 and 25, which run perpendicular to the ridges and grooves.

Surrounding FIG. 1A are graphs of the index of refraction, n(z) of the waveguide layers and of the intensity distribution Ix along the x axis within the central layer 10 of the waveguide.

Considering first the graph at the lefthand portion of FIG. 1A, it is seen that the refractive index $n_1$ of the central layer is higher than the refractive indices $n_2$ and $n_3$ of the cladding layer 12 and 14, respectively. The graph in the upper portion of FIG. 1A shows that the intensity distribution falls off in the radial direction as indicated by the characteristics 29 and 30.

The following considerations concern the case that the wavelength $\lambda_1$ of a guided wave with circular cylindrical phase fronts is equal to twice the radial distance $n_a$. In this case radially outward travelling radiation is reflected back toward the center. This behaviour relies on the principle of constructive interference by multiple reflections.

As a consequence the optical intensity decreases exponentially toward the outside, according to the curve 30. Due to the radial position of the ridges and grooves of the outer part only those field distributions oscillate, which have an odd number of radial nodal lines. A nodal line is an imaginary line, which runs along a region with minimal field energy. In the region 23 there is no back-reflection. The field distribution in the waveguide has therefore one radial nodal line, which runs through the center of the region 23.

At the wavelength $\lambda_1$ defined above, the diffraction grating of the inner part couples electromagnetic energy out of the waveguide. This causes the exponential decrease according to the curve 29. The emission is essentially perpendicular to the plane of the waveguide.

Shown within the structure of FIG. 1A are rays 34, which illustrate the radiation emitted by the grating. The rays 36 illustrate the wave, which is back-reflected from the grating of the outer part. The rays 34 which are emitted in the negative direction of the z axis are reflected by the mirror layer 18 in the opposite direction. These rays, together with the rays that are emitted in the positive direction of the z axis, pass out of the waveguide through the anti-reflection layer 16 into free space. Because of the radial nodal line of the field distribution, the output beam is essentially linearly polarized. Because of the spherical curvature of the waveguide structure, the bundle of rays 34 is focused at a point (not shown) along the z axis.

Preferred Applications of the Invention

Figure 2A:
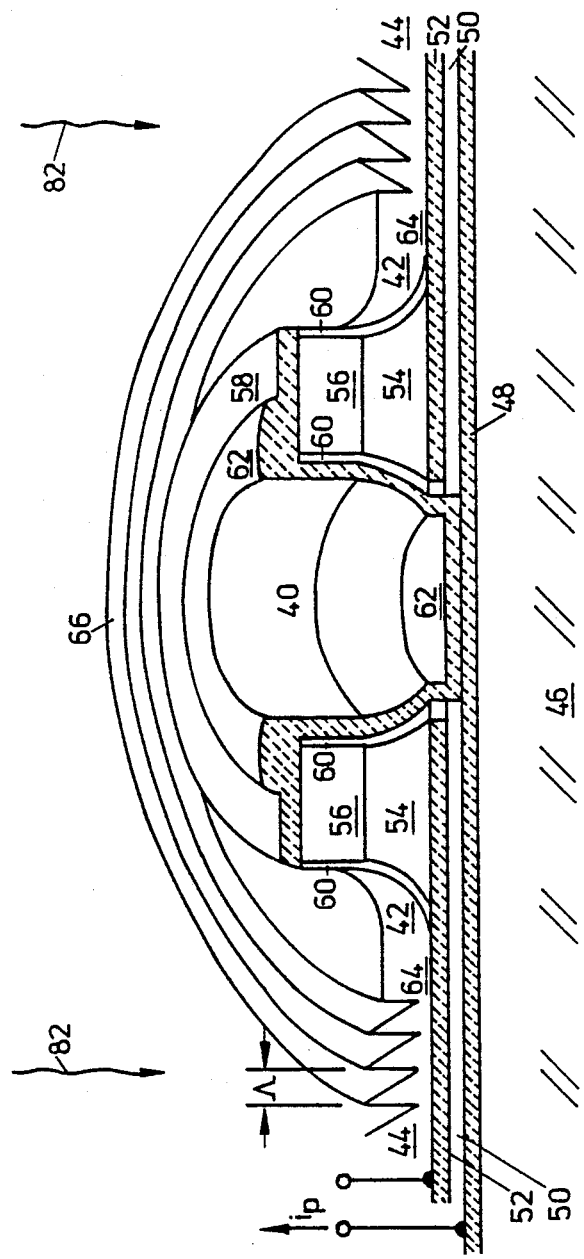
FIG. 2A shows a crossection of an opto-electronic transformer, which is situated in the center of a cylindrical diffraction grating, and shows a planar contact configuration matched to the cylindrical diode structure.

The FIGS. 2A and 2B show an application of the grating of the inner part 22 in the FIGS. 1A and 1B to collect electromagnetic radiation. It is proposed to collect radiation energy by a diffraction grating and to transport the energy in a waveguide to a photodetector. There, the optical energy is transformed into electric energy. FIG. 2A shows a solar cell 40, which is connected via a matching arrangement 42 (tapered waveguide) to a grating-waveguide configuration 44. FIG. 2B shows a top view of a combination of several units according to FIG. 2A.

The fabrication is carried out on a substrate 46 (glass), which has a surface with optical mirror quality. A conducting metal layer 48, an insulating layer 50 and an upper conducting layer 52 are evaporated. The upper metal layer 52 and the insulating layer 50 are removed in a circular area. Then an N-type doped polycrystalline silicon layer 54 (1 μm thick) is deposited, followed by a P-type doped polycrystalline silicon layer 56 (1 μm thick). A ring shaped metal contact 58 (10 μm radius) is evaporated. To the sides of the metal contact, the silicon is removed by a mesa etch, whereby a part of the tapered waveguide 42 and the ring-shape of the diode are formed. The slopes of the diode are covered with an insulating layer 60 by oxidation of the silicon. The ring contact 58 and the lower metal layer 48 are connected by a metal film 62. A transparent plastic film 64 (0.6 μm thick) is spun on the reflecting metal surface 62. The diffraction grating 66 is transferred to the plastic layer 64 by injection molding of a metal stamper under elevated temperature. The grating on the metal stamper is taken from a father grating by electroforming. The father grating is fabricated by holographic exposure of a photo resist film.

Figure 3:
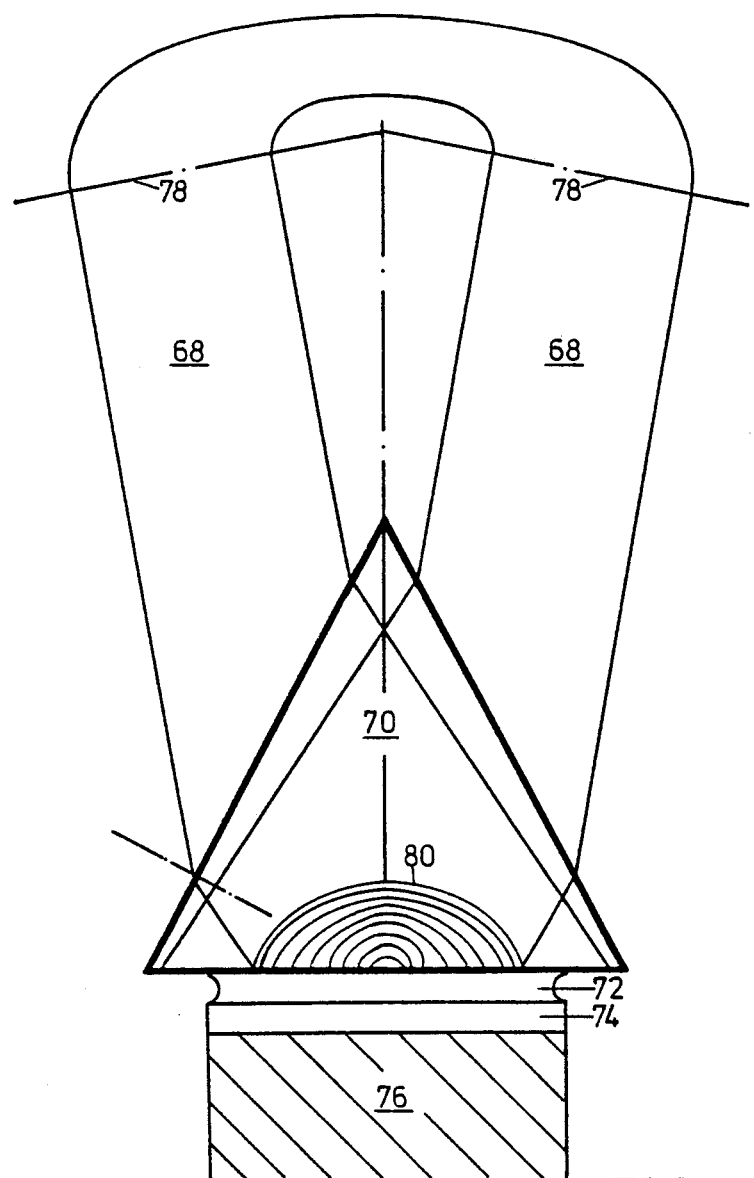
FIG. 3 illustrates a technique for the holographic generation of a ring pattern in a radiation sensitive film.

FIG. 3 illustrates the holographic method to generate a cylindrical grating. A laser beam 68 is irradiated through a conical prism 70 and a liquid 72, which matches the refractive indices, on a photo resist 74. The photo resist film is spun on the carrier 76 of the father grating. The laser beam 68 has planar or conical phase fronts 78 over the cross-section of the conical prism 70. Within the conical prism conical phase fronts are formed. In the plane of the photo resist film 74 is generated holographically a system 80 of rings, which exposes the photo resist film. The radial distance of the rings can be adjusted by varying the wavelength of the irradiated laser light or also by varying the inclination of the conical phase fronts 78 of the irradiated laser light. The inclination of the phase fronts 78 can be produced by a further conical prism (not shown), which is inserted into the beam, or by slightly focusing or defocusing of the laser beam 68.

After this description of the fabrication process of the cylindrical diffraction grating 66, further properties of the arrangement in FIG. 1A are discussed.

The grating-waveguide-configuration 44 is optimized for the wavelength range, in which sun light generates the greatest contribution to the photo current $i_p$ (wavelengths $\lambda$ around 0.5 μm). For this wavelength range, the radial distance $n$ of the grating lines is equal to the wavelength of the circular cylindrical wave in the waveguide (2nd order grating) and the grating generates phase reversal for vertically incoming radiation 82. The radius (several 100 μm) of the diffraction grating should be less than the coupling length of the grating. The coupling length of the grating is the length, within which a percentage of 90% of the intensity of a guided circular cylindrical wave is emitted out of the waveguide. The collecting area of the diffraction grating is 100 to 1000 times larger than the area for absorption of radiation in the solar cell. The waveguide should have a large numerical aperture, to enable the grating-waveguide-configuration 44 to transmit a relatively large range of wavelengths to the solar cell. The electrical energy is collected by the metal layers 48 and 52.

FIG. 2B show a top view of a combination of several units 83 according to FIG. 1A on a common substrate. The circular cylindrical gratings are situated at the corners of a regular hexagon (comparable to the arrangement of honey combs), to achieve maximum coverage of the area. This matrix of cylindrical diffraction gratings can be fabricated by a single step, if the mentioned father grating is provided with a corresponding matrix of gratings. The father grating can be fabricated by repeated exposure of the photo resist film 74 in FIG. 3 through the accordingly displaced conical prism (step repeat method).

Figure 4A:
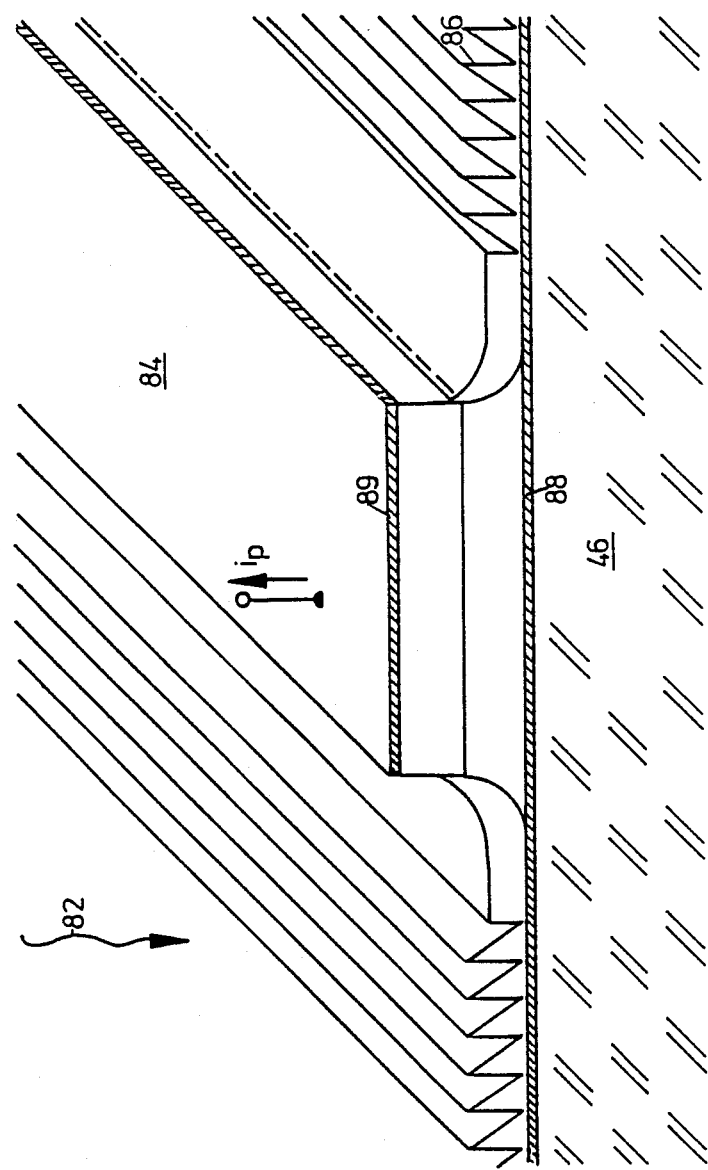
FIG. 4A shows an arrangement similar to FIG. 2A, but with the opto-electronic transformer having stripe geometry and with the cylindrical diffraction grating having the grating lines interrupted in sector shaped regions around the ends of the transformer.

In the arrangement according to FIG. 2B, about 70% of the area is covered by optically collecting gratings. The arrangement according to FIG. 4A is similar to FIG. 2A, but it is provided with a solar cell 84 of the form of a stripe (10 $\mu$m width). To the sides of the solar cell there are gratings 86 (width several 100 $\mu$m). In sector shaped regions (not shown) around the ends of the solar cell stripe, the grating lines are interrupted, leading to gratings 86 with essentially straight lines. The solar cell is provided with metal contacts 88 and 89.

Figure 4B:
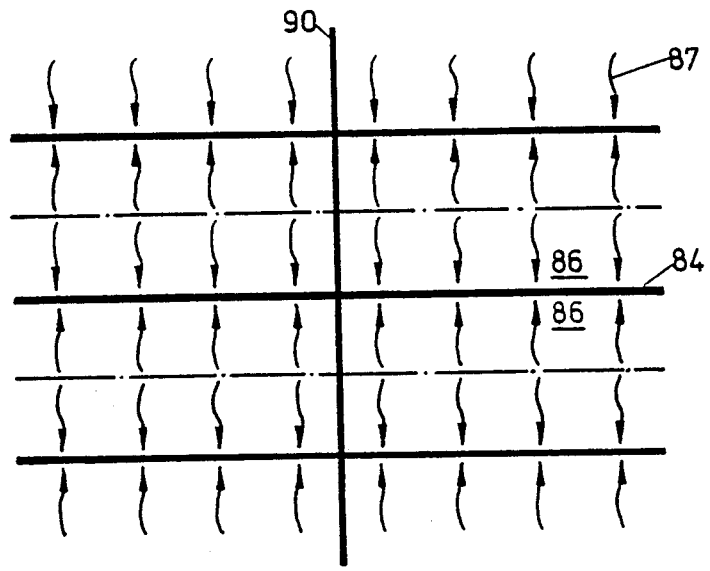
FIG. 4B shows an arrangement similar to FIG. 2B, but with stripe geometry.

FIG. 4B shows a top view of a combination of several units according to FIG. 4A on a substrate. On both sides of each solar cell stripe 84, a diffraction grating 86 is oriented toward the cell. The collection of the optical energy is illustrated by arrows 87. The electrical energy is collected by the contact stripe 90 and the metal film 88.

In comparison to FIG. 2B, the coverage of the area by the diffraction gratings 86 is increased to over 90%. The area of the collecting diffraction gratings is about 10 to 30 times larger than area for absorption of the radiation within the solar cells.

The arrangements in the FIGS. 2A, 2B, and 4A, 4B have the following advantages in comparison to solar cells, which use a lens for collection of the solar energy. The efficiency of the solar cells 40 and 84 is relatively high due to the low electrical series resistance (made possible by the large area contacts 58 and 89 covering the solar cell). The production costs are relatively low due to the planar technology, which allow mass fabrication.

Figure 5A:
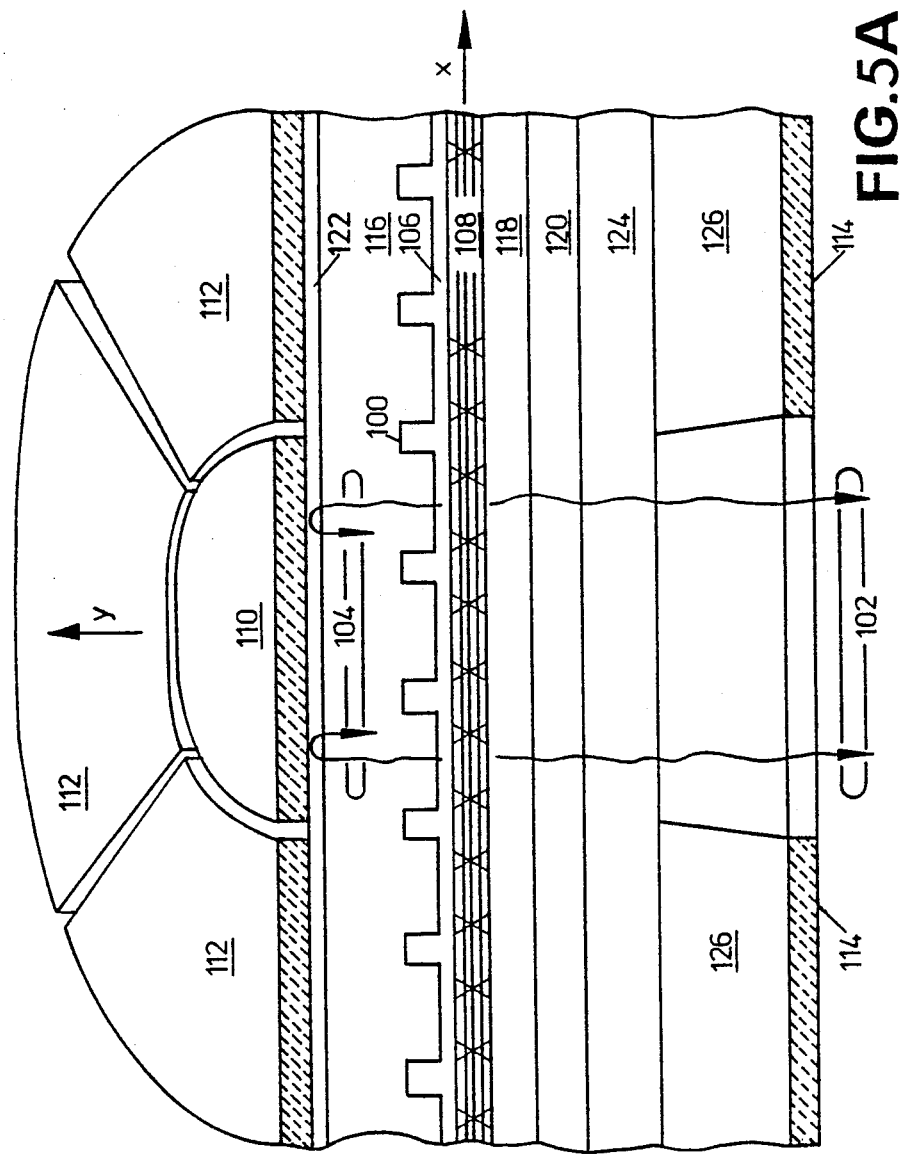
FIG. 5A shows a crossectional and partly representational view of the active portion of a multiple-quantum-well diode laser with a cylindrical diffraction grating and an absorption structure.
Figure 5B:
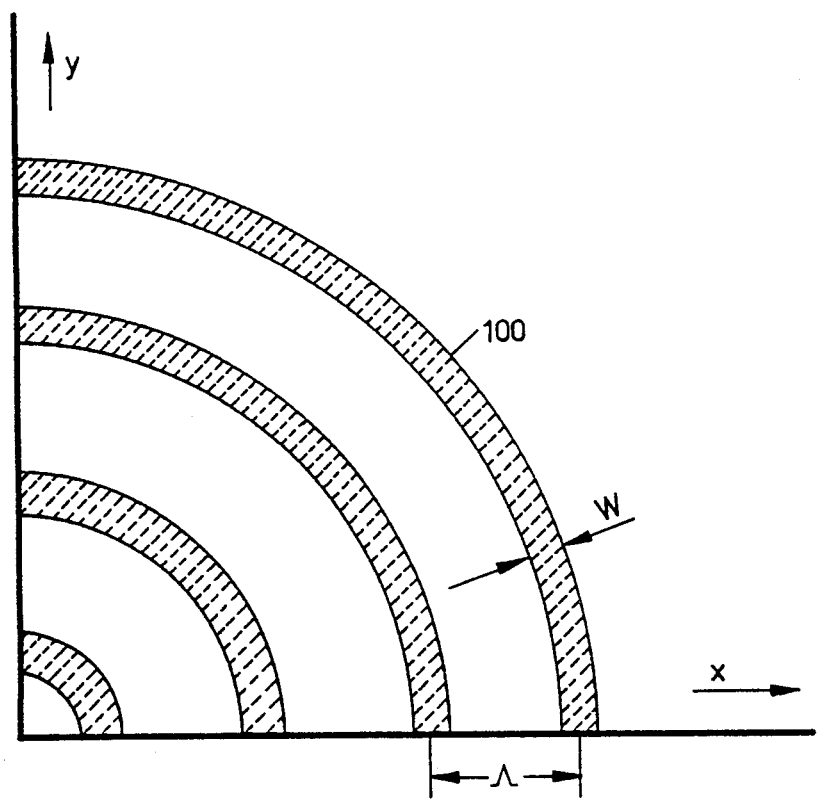
FIG. 5B shows a plan view of a part of the diffraction grating used in FIG. 5A.
Figure 5C:
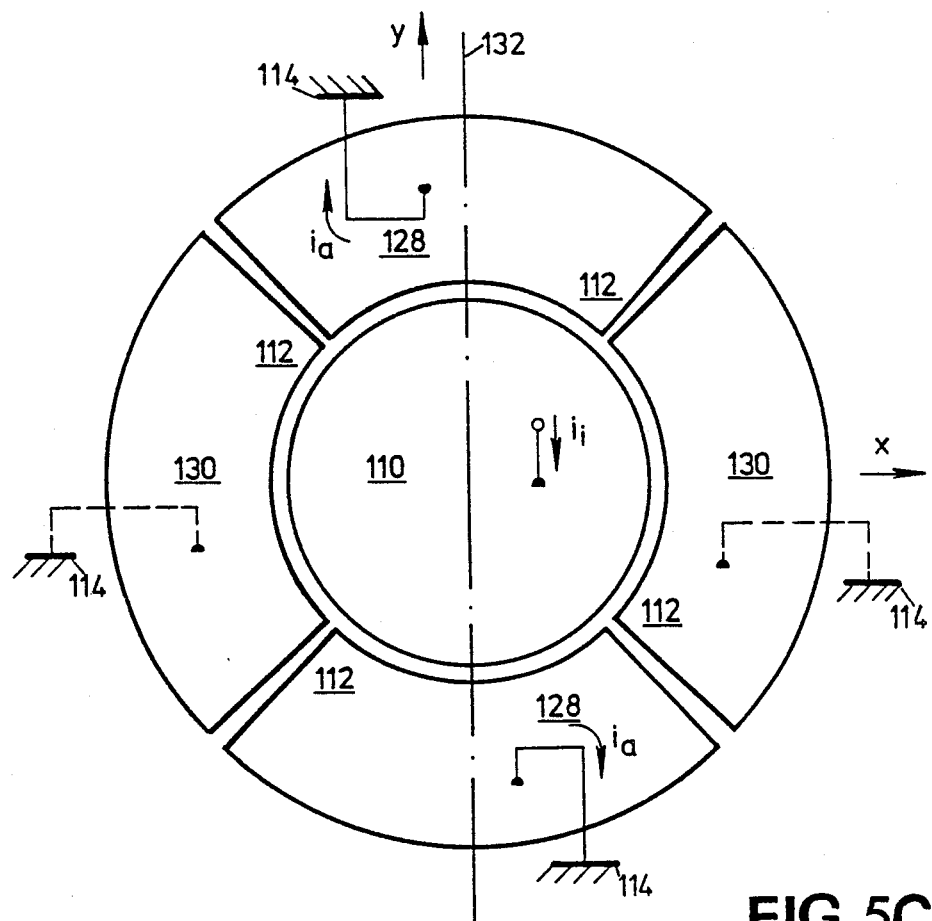
FIG. 5C shows a plan view of the contact segments of the arrangement in FIG. 5A.

The FIGS. 5A and 5B illustrate a semiconductor laser diode with distributed feedback and with a loss modulator. The emission is spectrally and spatially selective amplified by an arrangement similar to FIG. 1. FIG. 5A shows a cross-section of the laser with a resonator similar to FIG. 1, but with a circular cylindrical diffraction grating 100, which provides the back reflection and the coupling of energy of the guided wave into the beams 102 and 104. The grating is situated in the upper guide layer 106. FIG. 5B shows a top view of the grating and has indicated x and y Cartesian coordinates. The central layer 108 can amplify or absorb radiation, depending on the excitation. The excitation is controlled by the contact segments 110 and 112. FIG. 5C illustrates the contact segments 110 and 112. In the center is a circular contact 110. The outer region is provided with sector shaped contact segments 112.

The resonator is built into a luminescent diode, which is excited by a pair of contacts 110 and 114. The contact 114 has the form of a ring, to allow the extraction of vertically emitted radiation. The contact 110 is acting as a mirror, too.

The waveguide is formed by a central region 108, which is a multiple quantum well region. The quantum wells are formed by alternating $Al_pGa_{1-p}As$ and GaAs layers. The central region 108 is embedded between a P-type doped $Al_pGa_{1-p}As$ upper confinement layer 106 and a N-type doped AlpGa1-pAs upper cladding 116 on one side and an N-type doped $Al_pGa_{1-p}As$ lower confinement layer 118 and an P-type doped AlpGa1-pAs lower cladding layer 120 on the other side. The aluminum mole fractions (p=0.2 and q=0.6) of the ternary layers are chosen such that both a super lattice is formed in the central region 108 and the refractive indices of the waveguide layers decrease along the direction from the central region 108 to the cladding layers 116 and 120.

The grating 100 consists of a plurality of concentric circular boundary displacements forming ridges and grooves in the upper confinement layer 106. The top of the ridges in the upper confinement layer 106 is drawn in FIG. 5B in solid black.

The ridges have substantially vertical side walls. The ridges have constant radial width W and radial distance $n$. The radial distance $n$ of the ridges (about 0.25 $\mu$m) is equal to the wavelength in the guide (2nd order grating) at the free space operating wavelength $\lambda$. The wavelength $\lambda$ (about 0.8 $\mu$m) is determined by the wavelength of maximum amplification of the central region 108 under excitation. The radial width W is chosen equal to quarter of the wavelength in the guide, to maximize the vertical emission of the grating.

The radial position of the ridges is chosen such that maximum distributed feedback occurs for field distributions with an odd number of radial nodal lines.

To produce a low electric resistance for the current injected through the contacts 110 and 114, the upper cladding layer 116 and the lower cladding layer 120 are covered by a heavily P-type doped GaAs contact layer 122 and a heavily N-type doped $Al_xGa_{1-x}As$ contact layer 124. The aluminum mole fraction r=0.2 is chosen such that the layer 124 is transparent for the output beam 102.

The semiconductor layers are fabricated by a two-step-epitaxy-process. First the layers up to the upper confinement layer 106 are grown on a monocrystalline GaAs substrate 126 by molecular beam epitaxy. The diffraction grating is fabricated essentially by a grating mask written with an electron beam, and exposure by X-ray lithography. Then the remaining semiconductor layers are grown by epitaxy. The metal contacts are deposited by evaporation. Finally a window is etched into the substrate for the output beam 102.

The regions of the active layer 108 below the contact segments 110 and 112 can amplify or absorb radiation, depending on whether the diodes controlled by the contact segments are forward or reverse biased. The contact 114 and the contact layer 124 act as common contact for all diode regions.

Due to the segmentation of the upper contacts, several operation conditions of the device are possible. By forward biasing the diode below the disk contact 110, the central region 108 emits and amplifies optical radiation. Due to the back-reflection of the grating 100, a circular cylindrical standing wave is generated. If enough current is injected, the optical amplification can compensate for the optical losses, and laser action starts. The single frequency radiation is coupled into a beam 102 by the grating. The relatively large area of the emitting region causes a beam with a narrow radiation lobe (aperture angle smaller 1°). FIG. 1A has illustrated the exponential decrease (curve 30) of the intensity in the radial direction due to the action of the grating of the outer region 22. At the slopes of the substrate 126, which form the border of the emitting area, diffracted waves of relatively low intensity are generated. Therefore the beam 102 has a relatively high side lobe suppression.

In FIG. 5A the diameter of the active region 108 below the disk contact 110 is nearly equal to the diameter of the volume filled by the optical field. The relatively simple laser diode structure has a low threshold current in particular for short wavelength laser radiation, since then the area for current injection can be kept small.

FIG. 5C shows schematically the connection of two contact segments 128, which are arranged symmetrically with respect to the center of the grating, to the common contact 114. Due to the irradiation of light, the diode regions below the contact segments 128 have higher absorption than the diode regions below the contact segments 130, which are rotated by 90° with respect to the segments 128. The higher absorption is caused by the extraction of carriers out of the diode regions below the contact segments 128. The carrier extraction leads to the current $i_a$. In the current regions below contact segments without connection to the common contact, the collection of electron-hole-pairs leads to saturable absorption.

As a consequence of the spatial distribution of the absorption, the field energy in the laser resonator is preferentially concentrated in a resonator mode with one radial nodal line parallel to the symmetry line 132 of the contact segments 128. The output beam 102 is polarized along the direction of the line 132. The direction of polarization can be rotated by 90° by connecting the contact segments 130 instead of the contact segments 128 to the common contact. These alternative connections are shown in FIG. 5C as dashed lines.

By increasing the number of the essentially sector shaped contact segments 112, smaller angular steps of the rotation of the polarization can be realized. The sector shape is an optimum for circular cylindrical resonators.

The resonator mode with the rotated nodal line has the same total loss—and therefore the same quality factor—as the primary resonator mode before the rotation. Intensity and frequency of the laser beam remain essentially constant during the rotation.

It is mentioned that a change of the resonator mode selection also can be achieved by a change of the angular distribution of the optical amplification in the laser resonator (for example by a corresponding radial segmentation of the disk contact 110). The important point is to take influence on the quality factors of the resonator modes. To achieve the selection of a particular resonator mode from the ensemble of the possible modes, an increase of its quality factor by a few percent relative to the quality factors of the other modes is sufficient.

In conclusion, a laser beam with rotary polarization is generated by variation of the angular distribution of the optical losses (or amplification) in the laser resonator.

The contact segmentation shown in FIG. 5C makes possible the selection of a resonator mode with one radial nodal line. By a proper choice of the angular distribution of the optical losses, resonator modes with several radial nodal lines can be selected.

The FIGS. 6A and 6B show other angular distributions of the optical absorption. The black drawn areas 134 and 136 illustrate regions with higher absorption. This angular distribution can be achieved for example by a correspondingly larger number of contact segments 112 in FIG. 5A and by corresponding electrical connections. The spatial distribution of absorption in FIG. 6A gives the highest quality factor to the resonator mode with one radial nodal line 138 along the y-axis. Therefore, this mode oscillates preferentially. The spatial distribution of the losses in FIG. 6B leads to preferential oscillation of the resonator mode with three radial nodal lines 140, which are rotated against each other by 120°. The aperture angles $\phi_v$ of the sectors in the FIGS. 6A and 6B and the absorption of the sectors is chosen such that both resonator modes have essentially equal quality factors.

Figure 7:
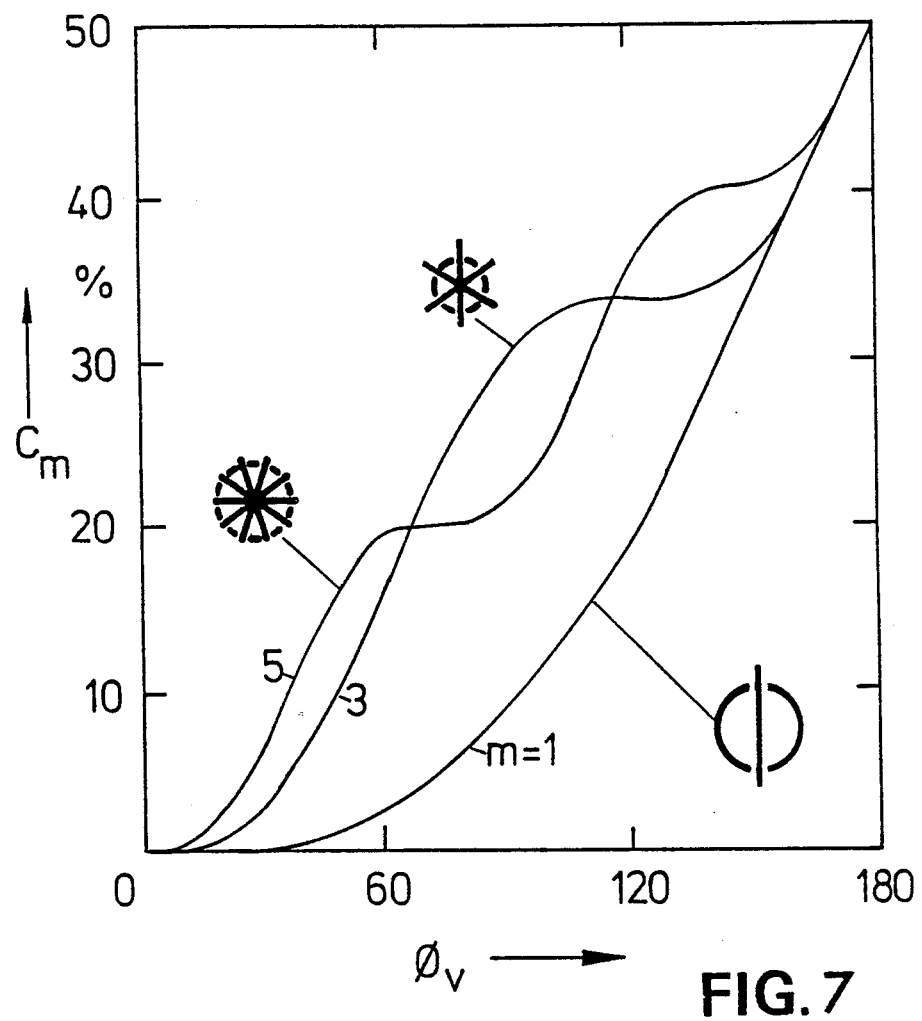
FIG. 7 shows the confinement factor $C_m$ of the wave energy within a sector according to the FIGS. 6A or 6B as a function of the aperture angle $\phi_v$. Parameter is the mode order m. The insets illustrate the intensity distributions of the individual modes.

For the determination of the aperture angles $\phi_v$, the diagram in FIG. 7 can be used. FIG. 7 shows the confinement factor $C_m$ of a sector shaped region with absorption versus the aperture angle $\phi_v$ of the sector for several modes. Parameter is the mode index m, which corresponds to the number of radial nodal lines in the intensity distribution of a mode. All considered modes have at least one radial nodal line in the center of the sector of higher absorption (or lower amplification).

The calculation of the $C_m$ is carried out via the equation $$C_m = \frac{2}{\pi} \int_0^{\phi_v/2} d\phi \sin^2(m\phi). \tag{1}$$

To each curve in FIG. 7, the spatial energy distribution of the corresponding mode is plotted qualitatively. The sector of higher absorption is arranged symmetrically with respect to the y-axis.

If the resonator is loaded simultaneously with the lossarrangements according to FIG. 6A and 6B, both resonator modes will oscillate simultaneously. To achieve these operation conditions, the angular position and the aperture angle of the sectors are chosen such that both resonator modes have the same quality factor. Switching of the absorbing regions doesn't change significantly the quality factors of lasing modes so that the intensity and the frequency of the laser beam remain essentially constant.

By adding further absorbing regions correspondingly, resonator modes with more radial nodal lines can oscillate in a well controlled manner, individually or together with other modes. Therefore, the described arrangement makes possible to produce an oscillator signal with time dependent spatial mode content by a variation of the spatial distribution of the resonator losses (or resonator amplification). In the following, the production of such an oscillator signal is denoted as mode modulation.

The technique of mode modulation has been illustrated by modes with an odd number of radial nodal lines. By a corresponding design of the resonator in FIGS. 5A, 5B, 5C, mode modulation can be realized with modes, which have an even number of radial nodal lines.

Figure 8B:
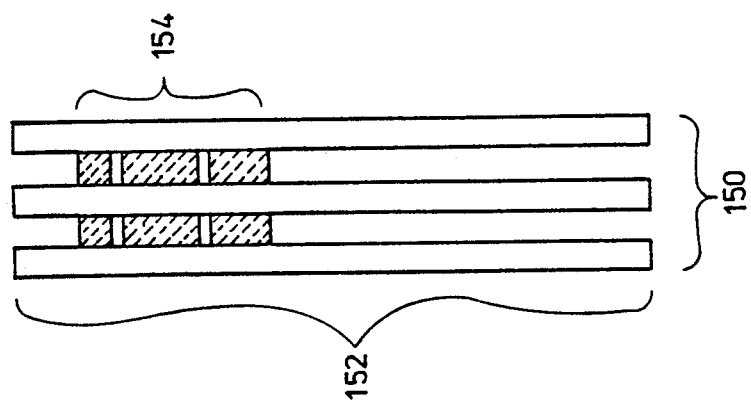
FIG. 8A and 8B illustrate the arrangement of external controllable absorbers within an arrangement of laterally coupled stripe laser resonators.
Figure 8A:
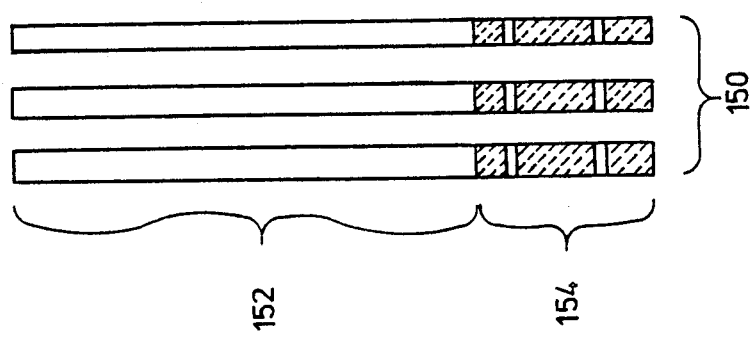

It is mentioned that mode modulation is also possible with other types of oscillators. The FIGS. 8A and 8B show schematically arrangements of M stripe laser resonators (diode laser array), which are laterally coupled by a thin film waveguide, with integrated absorbers. According to the theory, a system of M coupled resonators 150 has at least M resonator modes (super modes) The controlled selection of individual resonator modes can be achieved by a proper variation of the amplification in the region 152. Alternatively, the absorption between the stripes can be influenced by the regions 154 in FIG. 8B. By an appropriate choice of the variation of the absorption between the laser resonators 150, individual or several resonator modes can be excited so that mode modulation is realized.

Figure 9:
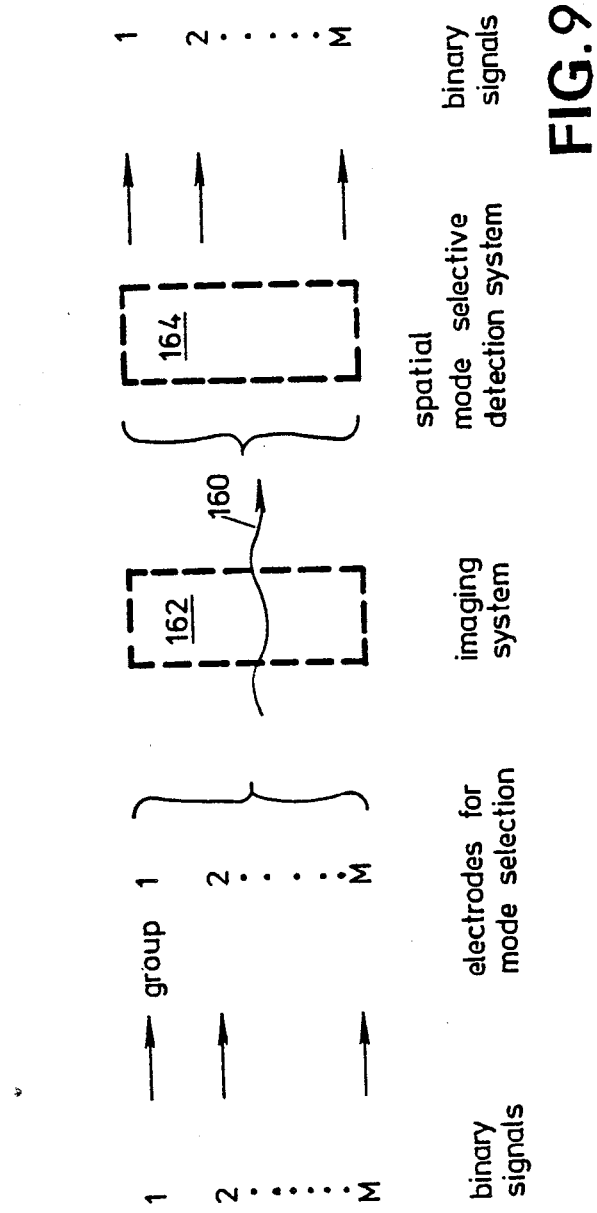
FIG. 9 shows an arrangement for the information transmission by modulation of the spatial distribution of the field over the crossection of a laser beam (mode modulation).

The optical field of each resonator mode generates a laser output beam, which can be used for the transmission of information. FIG. 9 illustrates an example for the transmission of a signal comprising several binary digits.

The imaging system 162 is formed by a system of lenses, by way of example. Also the use of a multimode fiber supporting the propagation of a set of modes adapted to the mode content of the laser beam 160 would be possible.

The spatially mode-selective detector arrangement 164 in FIG. 9 has to be constructed in a different manner, depending on whether the laser beam is analyzed in the Fourier-optic frequency domain or space domain (qualitatively corresponding to the far-field or the near-field of the laser beam).

Figure 10:
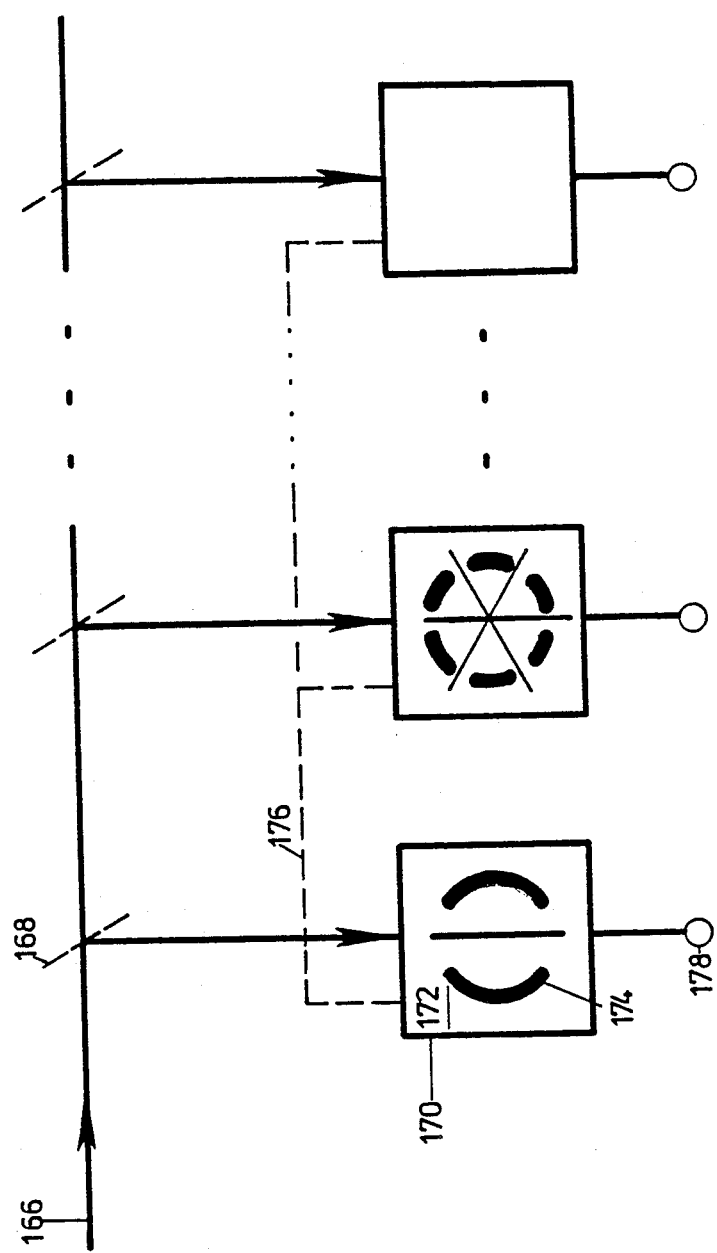
FIG. 10 and FIG. 11 show arrangements for the detection of a mode modulated signal by heterodyne detection.

The analysis in the space domain can be realized for example by optical heterodyne detection. FIG. 10 shows the detector arrangement schematically. The signal 166 is mode modulated with M modes by means of a laser according to the FIGS. 5 and 6. The signal 166 is divided between M heterodyne detectors 170 by means of the beam splitters 168. Each of the detectors 170 contains a laser 172 (not shown), which oscillates in one of the modes of the signal beam 166. The different modes are illustrated in FIG. 10 by a schematic graph of their spatial intensity distribution.

The lasers 172 are phase locked, as illustrated by the dashed line 176. By this way each detector 170 selects the information transmitted by the corresponding mode. At the M exit ports 178 of the heterodyne detectors, the transmitted information is available in the form of M signal values. Due to the modulation technique, the sum of the signal values is essentially constant as a function of time.

Figure 11:
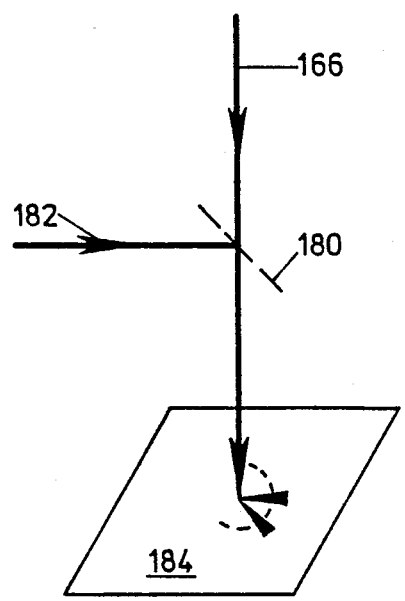

FIG. 11 shows a detector, which realizes spatial mode selection by a single heterodyne detector. Via the beam splitter 180, the mode modulated signal 166 is superimposed polarization matched to a laser beam 182, which is composed of the M modes used for information transmission. The spatial mode selection is achieved by segmentation of the detector area 184. The detector area can be divided for example into sector shaped regions, with the sectors arranged according to the black drawn sectors in the FIGS. 6A and 6B. Each of the detectable modes is associated with a group of sector shaped detectors, which correspond for example to the group of sectors in the FIGS. 6A and 6B. The group of sectors arranged according to FIG. 6A is used for the detection of the mode with one radial nodal line. The group of sectors arranged according to FIG. 6B is used for the detection of the mode with three radial nodal lines. For the detection of higher order modes a correspondingly finer segmentation is chosen.

In conclusion a technique is described for multichannel signal transmission by mode modulation. The technique makes possible the transmission of high data rates, whereby the speed of the individual components is less important, due to the parallel transmission in several space channels.

In contrary to mode modulation, phase modulation of the laser light will require broadband components, if higher data rates are transmitted. Lasers can be modulated via the pump rate. The resulting modulation of the amplification is often accompanied by a modulation of the refractive index of the active medium, which causes a phase modulation of the laser light. Apart from slow spurious modulation for example due to variations of temperature or amplification saturation, it is generated phase modulation in the literal sense of the word, which means that the phase deviation $\Delta\theta$ is essentially independent of the modulation frequency $f_m$.

With respect to noise in the receiver of a signal transmission line, frequency modulation in the literal sense of the word is particular advantageous, provided the spectral amplitude distribution of the signal is uniform. Frequency modulation in the literal sense of the word has a frequency deviation $\Delta f$, which is independent of the modulation frequency $f_m$. In semiconductor lasers, broadband frequency modulation can be achieved by proper distortion of the signalband of the modulating injection current (pre-emphasis).

Figure 12:
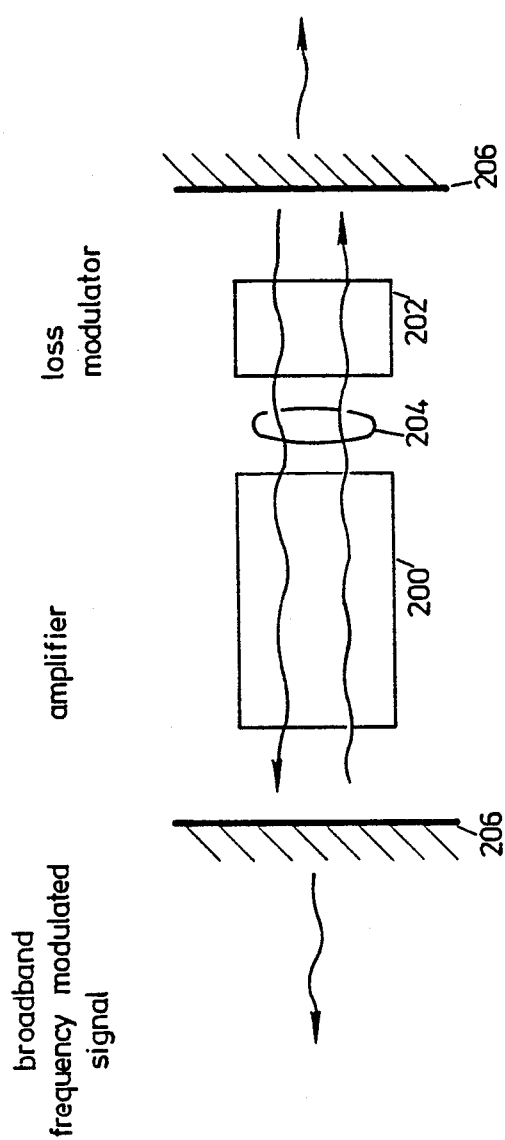
FIG. 12 shows schematically a laser with an integrated absorption modulator for high speed frequency modulation.

FIG. 12 illustrates schematically a laser with a loss modulator, which is integrated into the resonator. The amplifier 200 and the loss modulator 202 are coupled via the wave 204, which is reflected back and forth between the mirrors 206. Therefore, the loss modulation in the modulator 202 leads in the amplifier 200 to a modulation of the amplification. The accompanying modulation of the refractive index of the amplifier medium causes a phase angle modulation of the laser light. Apart from slow spurious modulation for example due variations of the temperature, frequency modulation in the literal sense of the word is generated. The transferable signal band-width is of the order of the laser modulation band-width, which is of the order of the laser resonance frequency $f_r$ in a semiconductor laser.

By a small signal analysis of the laser rate equations, the achievable frequency deviation of 66 f due to a relative change $\Delta q$ of the quality factor of the laser mode can be calculated:

$$\Delta f / \Delta q = \beta / (4\pi\tau_p). \tag{2}$$

In equation (2), $\beta$ is the coupling factor of the changes of amplification and refractive index in the amplifier 200 (factor of the amplitude-phase-coupling) and $\tau_p$ is the photon lifetime of the laser mode.

For high speed GaAs-semiconductor laser structures ($f_r = 10$ GHz), it is $\beta \approx 3$ and $\tau_p \approx 1$ ps. According to equation (2), a modulation of the quality factor of $\Delta g = 1\%$ yields a frequency deviation $\Delta f$ of about 2.4 GHz independent of the modulation frequency $f_m$, provided the modulation frequency $f_m$ is smaller than the laser resonance frequency $f_r$.

The semiconductor laser diode described in FIGS. 5A, 5B, 5C operates as laser with intracavity loss modulator, if a modulating voltage $U_m(t)$ (t is the time) is applied between the contact segments 128 and the common contact 114 in FIG. 5C. The diode regions below the contacts 128 should be reverse biased.

Figure 13:
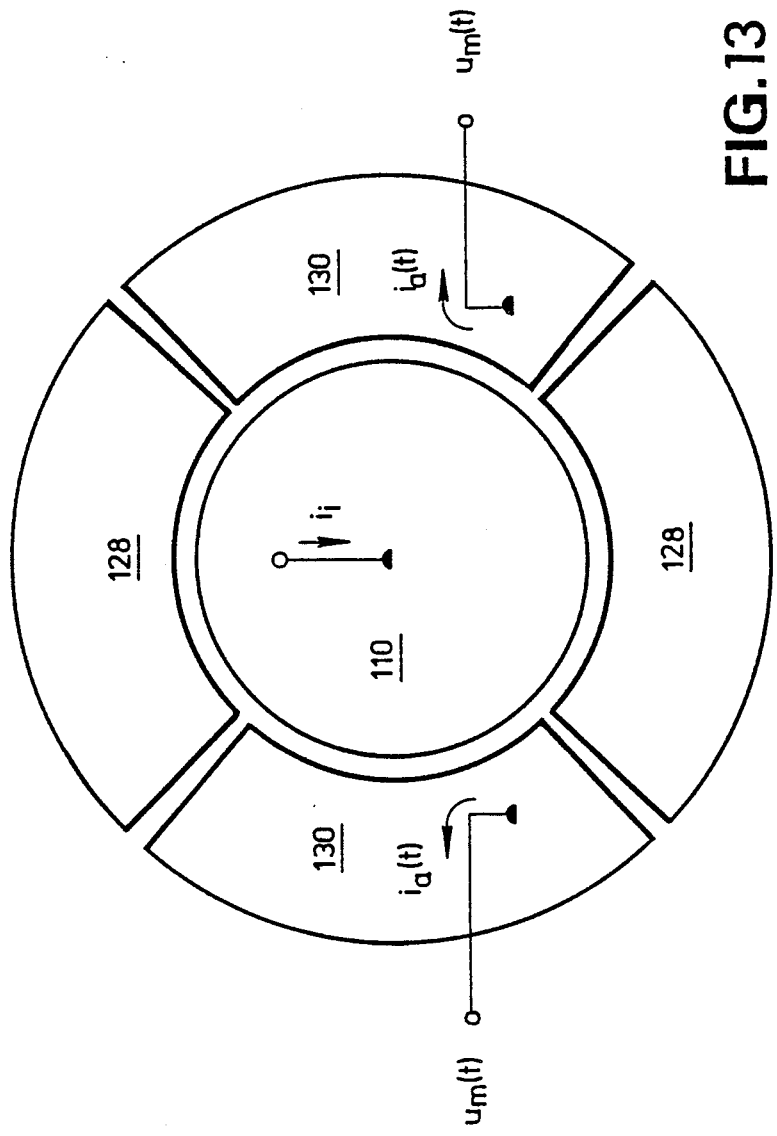
FIG. 13 shows an arrangement for the control of the contacts of a laser diode according to FIG. 5A for high speed frequency modulation.

FIG. 13 illustrates these operation conditions. The modulation of the electric field across the PN-junction of the diodes causes a modulation of the quality factor of the resonator mode. Because of the exponential decrease of the optical field density in the radial direction due to the back-reflection of the grating 100, the loss modulation of the resonator mode is relatively small, which nevertheless causes a relatively efficient frequency modulation, according to equation (2). The influence of the optical field on the modulator (for example saturation of the absorption) is kept small.

Figure 14:
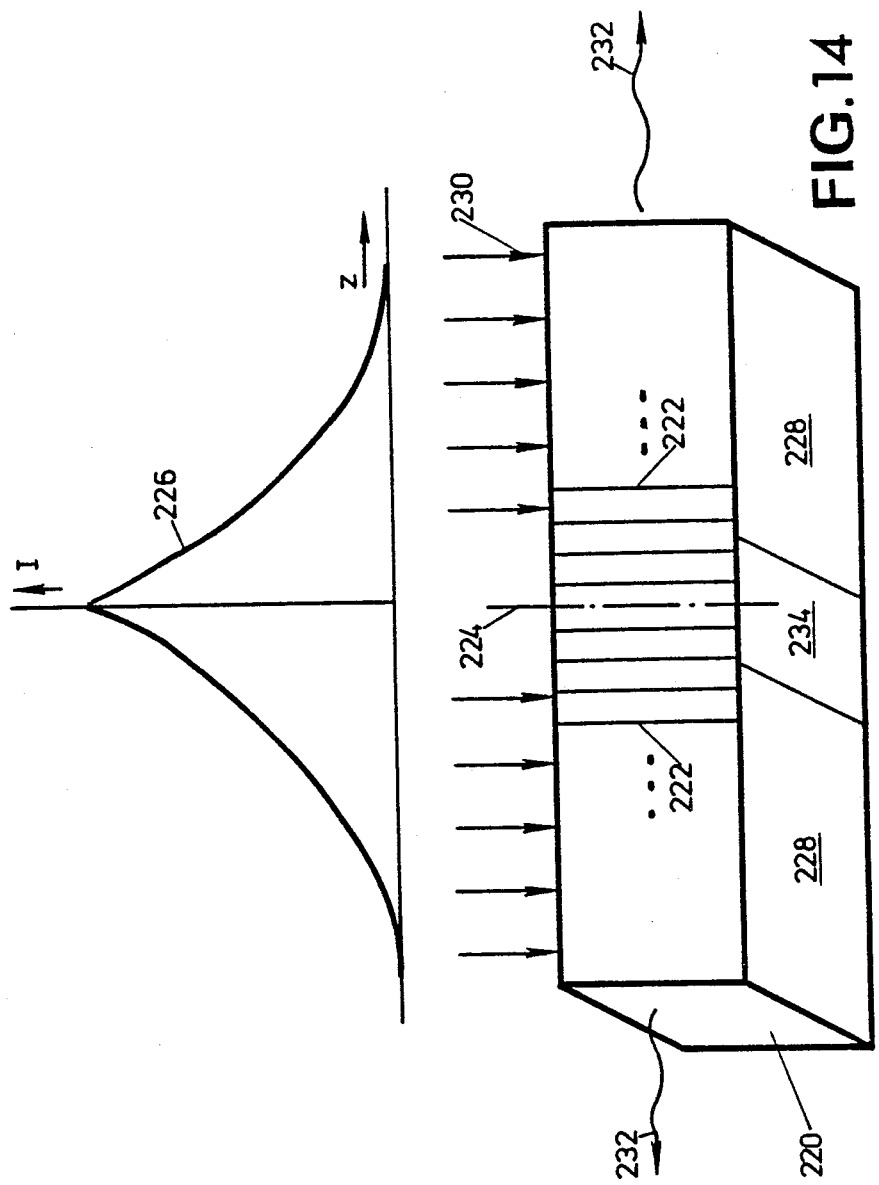
FIG. 14 shows schematically a laser with a two-dimensional waveguide, a diffraction grating with a quarter-wavelength-shift and an absorption arrangement in the region of maximum wave energy density.

FIG. 14 shows schematically a laser with a two-dimensional waveguide 220 and a diffraction grating 222 with a quarter-wavelength-shift in the center 224 (quarter wavelength phase-shifted distributed feedback laser) In the upper part of FIG. 14 the intensity distribution 226 is plotted along the laser axis z. The laser is pumped (illustrated by the arrows 230) in the amplifier section 228 over most of its length so that laser radiation 232 is emitted through the waveguide end ports.

In the center region 224, a modulator section 234 is provided, which has an absorption coefficient $A_{mod}$ or a refractive index $N_{mod}$ externally controllable along the direction of propagation z of the guided wave. Due to the positioning of the modulator 234 in the region of maximum optical field density, the length of the modulator along the z axis can be kept relatively small. By varying the absorption coefficient $A_{mod}$ or the refractive index $N_{mod}$, the laser emission frequency can be tuned or modulated. The relatively small length of the modulator section 234 and the resulting small electrical and thermal capacity makes possible fast modulation.

In general, a technique has been described for broadband frequency modulation (in the literal sense of the word) of an oscillator by modulation of the quality factor of the resonator mode. To improve the modulation capability of an oscillator, a quality modulator or a phase modulator have been inserted at appropriate positions into a resonator with distributed feedback.

Figure 15:
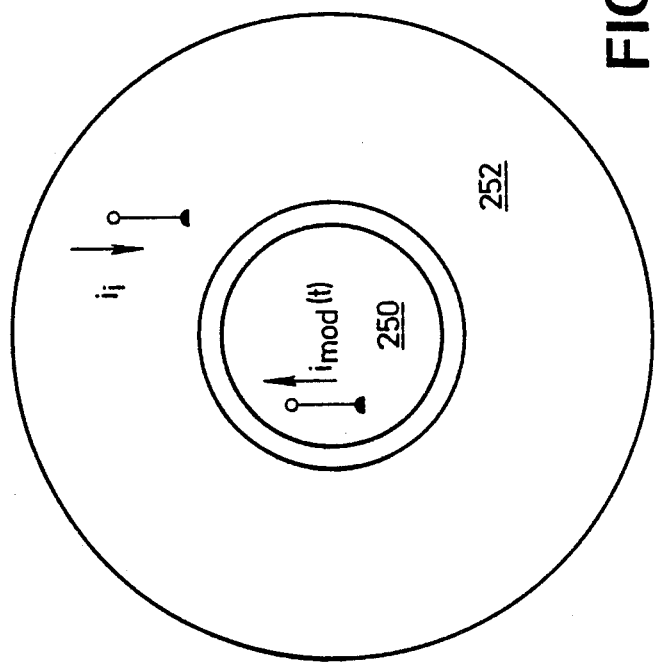
FIG. 15 shows an arrangement for the control of the contacts of a laser diode according to FIG. 5A for the generation of picosecond pulses.

In the following a technique for the generation of short pulses by means of the resonator according to FIGS. 5A, 5B, 5C is described. The technique uses the principle of switching of the quality factor of the resonator. FIG. 15 shows the contact of a semiconductor laser similar to the laser diode in FIGS. 5A, 5B, 5C, but having the disk contact 110 separated into an inner contact 250 and an outer contact 252. Through the outer contact, the laser current $I_i$ is injected. At the inner contact 250, a constant voltage U and an alternating current $I_{mod}(t)$ are applied. By this way, large signal modulation of the absorption in the waveguide below the contact 250 is achieved. The laser output signal then consists of short pulses, which are synchronous with the modulation frequency. Due to the relatively high density of the optical field in the region of the center of the resonator, the switching of the resonator quality factor can be realized by a relatively low modulation current.

Figure 16:
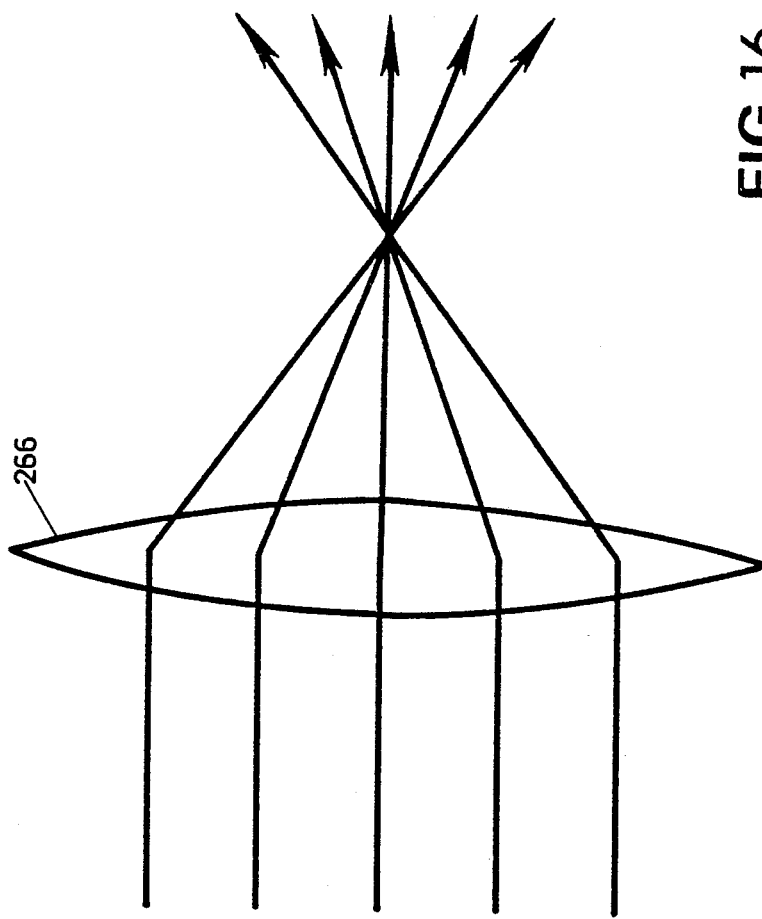
FIG. 16 shows a two-dimensional matrix of emitters according to FIG. 5A with absorbers between the emitters for the control of the characteristics of the laser output beam.

FIG. 16 illustrates a combination of emitters 260 according to FIGS. 5A, 5B, 5C on a common substrate 261. The emitters 260 are optically via a thin film waveguide by circular cylindrical leaky waves 262 of the resonators. The emitters are electrically controllable separately by at least one contact per emitter, which is not common to the emitters 260. The optical fields of all emitters can be phase locked by the leaky waves. The arrangement in FIG. 16 makes possible the generation of a single frequency laser beam, which can be focused onto a small spot.

By a variation of the amplification of the individual emitters 260 via the laser currents i or by a variation of the absorption in the loss modulators 264 between the individual emitters 260, a variation of the intensity distribution and of the phase distribution across the emitter matrix can be achieved. This makes possible a stirring of the laser rays. If the absorption of the loss modulators 264 is sufficiently high, the emitters 260 can be optically isolated from each other.

In FIG. 16, the laser rays run through a lens 266. This makes possible enhanced stirring of the laser rays.

Figure 17:
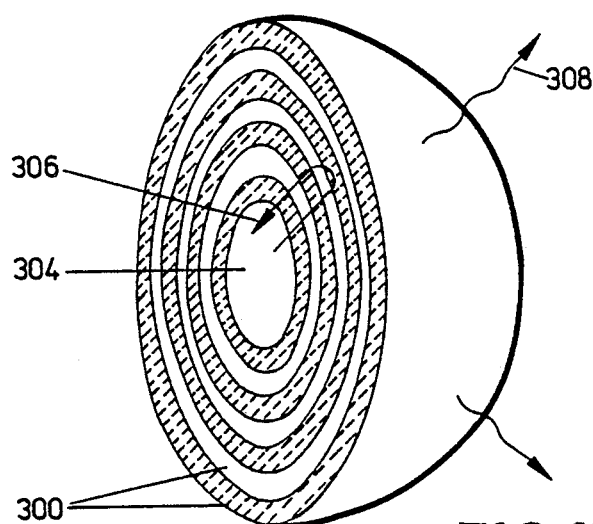
FIG. 17 illustrates a spherical energy cavity with distributed back reflection.

An essentially spherical resonator with distributed feedback is an advancement of the resonator shown in FIG. 1. FIG. 17 shows a sphere, which consists of a large number of essentially transparent shells 300. The shells or the boundaries between the shells are slightly absorbing. The shells have an alternatingly higher and lower speed of propagation or an alternatingly higher and lower absorption for the applied waves. The arrangement according to FIG. 17 is storing energy of a field of waves, which is irradiated or generated in the center 304, since waves running radially outward (illustrated by the ray 306) are reflected backward to the center 304. Due to the large number of shells 300, the wave can leave the sphere only strongly attenuated. The absorption of the waves causes an increase in temperature of the shells 300 so that heat radiation (illustrated by the rays 308) can be coupled out of the sphere. The energy of the wave is spread before being transformed into heat in the shells. Advantageously, the arrangement avoids local overheating in the center during the generation of the heat radiation.

There has thus been shown and described a novel information transmission system for optical wave devices which fulfills all the objects and advantages sought therefor. Many changes, modifications, variations and other uses and applications of the subject invention will, however, become apparent to those skilled in the art after considering this specification and the accompanying drawings which disclose preferred embodiments thereof. For example, while thin-film oscillators are shown and described, deviations from these specific thin-film structures will occur to those skilled in the art. All such changes, modifications, variations and other uses and applications which do not depart from the spirit and scope of the invention are deemed to be covered by the invention which is limited only by the claims which follow.

What is claimed is:

1. An apparatus for varying a laser beam including first means comprising a semiconductor laser for emitting said laser beam essentially perpendicular to the substrate on which the active region of said semiconductor laser is deposited;

the improvement wherein proximate to said semiconductor laser is a second means for varying the spatial mode contact of said laser beam, which includes a material, through which at least a portion of the laser radiation generated by said semiconductor laser propagates, with a profile of the complex optical dielectric constant, which is variable by a quantity selected from the group comprising electrical charge and optical radiation; thereby varying said spatial mode content of said laser beam.

2. The improvement defined in claim 1, wherein the profile of the imaginary part of said complex optical dielectric constant is variable.

3. The improvement defined in claim 2, wherein at least a part of said material with said variable profile of the imaginary part of the complex optical dielectric constant at least partially absorbs said laser radiation.

4. The improvement defined in claim 1, wherein the profile of the real part of the said complex dielectric constant is variable.

5. The improvement defined in claim 1, wherein said means for varying the spatial mode content of said laser beam varies the polarization of said laser beam.

6. The improvement defined in claim 1, wherein said semiconductor laser includes a diffraction grating.

7. The improvement defined in claim 1, wherein said means for varying the spatial mode content of said laser beam modulates the laser beam with an information signal and wherein said apparatus for varying a laser beam includes means for the detection of the information signal transmitted by the modulation of the spatial mode constant of the laser beam.

8. The improvement defined in claim 7 wherein said apparatus for varying a laser beam includes a fiber waveguide supporting the propagation of a set of spatial mode including the spatial mode content of the laser beam transmitted from said laser to said means for detection.

9. The improvement defined in claim 7, wherein said means for detection is a coherent detection scheme.

10. The improvement defined in claim 1, wherein said material with said variable profile of the complex optical dielectric constant is proximate to a solid state rectifying junction, for varying said profile of the complex optical dielectric constant.

11. The improvement defined in claim 10, wherein said solid state rectifying junction extends in a plane perpendicular to the direction of propagation of said laser beam.

12. The improvement defined in claim 1, wherein said material with said variable profile of the complex optical dielectric constant extends in at least one region having a base of the form of a sector, which lies in a plane perpendicular to the direction of propagation of said laser beam.

13. The improvement defined in claim 3, wherein said material with said variable profile of the imaginary part of the complex optical dielectric constant is proximate to an electrically reverse biased solid state rectifying junction, for varying said profile of said imaginary part of the complex optical dielectric constant.

14. The improvement defined in claim 1, wherein said means for varying the spatial mode content of said laser beam stirs said laser beam.

15. An apparatus for varying a laser beam with controlled intensity including first means for generating said laser beam with controlled intensity and including second means for varying a quantity of said laser beam selected from the group consisting of spatial mode content, phase angle frequency;
the improvement wherein said second means for varying a quantity of said laser beam includes a material, through which at least a portion of the laser radiation generated by said laser propagates, with a variable profile of the absorption constant, thereby varying said quantity of said laser beam with controlled intensity.

16. The improvement defined in claim 15, wherein said first means includes a semiconductor laser by having included an active region of semiconductor material capable of generating said laser radiation and wherein said material with said variable profile of the absorption constant is proximate to a solid state rectifying junction.

17. The improvement defined in claim 16, wherein said solid state rectifying junction is reverse biased.

18. The improvement defined in claim 16, wherein, said semiconductor laser, which comprises means for emitting said laser beam essentially perpendicular to the substrate on which said active region of said semiconductor laser is deposited.

19. The improvement defined in claim 16, wherein said semiconductor laser is provided with a diffraction grating.

20. The apparatus defined in claim 16, wherein said semiconductor laser is provided with at least two substantially parallel stripe waveguides, which are laterally coupled by a wave-transmitting medium.

21. A device for producing a laser beam with controlled intensity having modulated a quantity selected from the group consisting of spatial mode content, phase angle and frequency; said device comprising a semiconductor laser; means for passing an electrical current through said semiconductor laser to cause same to be operated above its laser threshold, thereby to produce said laser beam with controlled intensity; a material, which is proximate to a solid state rectifying junction and through which at least a portion of the laser radiation produced by said semiconductor laser propagates; means for applying a reverse bias to said solid state rectifying junction so that at least a part of said material at least partially absorbs said laser radiation; means for superimposing a modulation signal on said reverse bias of said solid state rectifying junction, thereby modulating said quantity selected from the group consisting of spatial mode content, phase angle and frequency.

22. An apparatus for controlling waves including a waveguide configured to confine and guide the energy of propagating waves and comprising at least one wave-transmitting medium having a substantially curviplanar boundary and including a diffraction grating comprising a plurality of blazed grating lines configured to scatter wave energy with respect to guided waves having phase fronts extending substantially parallel to said grating lines;
the improvement wherein a first plurality of said blazed grating lines of the diffraction grating form a first region, and wherein a further plurality of said blazed grating lines of the diffraction grating form a further region, whereby the grating lines of said further region are substantially oppositely blazed with respect to the grating lines of said first region, thereby optimally scattering by said first plurality of grating lines wave energy with respect to a first group of said guided waves, and thereby optimally scattering by said further plurality of grating lines wave energy with respect to a further group of said guided waves, wherein said further group of said guided wave propagated essentially oppositely with respect to said first group of guided waves.

23. The improvement defined in claim 22, wherein the distance between at least some successive grating lines of said grating lines is substantially $k\lambda/2$, wherein k is an integer and λ is the wavelength of said guided waves.

24. The improvement defined in claim 23, wherein at least some of said grating lines are forming a distributed reflector by being spaced and shaped to scatter wave energy of said first group of guided waves with respect to said further group guided waves, whereby said diffraction grating back-reflects energy from said guided waves into said guided waves and produces a standing wave pattern within the waveguide.

25. The improvement defined in claim 23, wherein at least some of said grating lines are spaced and shaped to scatter wave energy optimally at a 90 degree angle.

26. The improvement defined in claim 22, wherein said wave-transmitting medium comprises a semiconductor material.

27. The improvement defined in claim 26, wherein said wave-transmitting medium comprises a semiconductor material selected from the group consisting of Si; GaAs; Ga$_{l-x}$Al$_x$As; Ga$_x$In$_{l-x}$As$_y$P$_{l-y}$; and Ga$_x$In$_{l-x}$As$_y$Sb$_{l-y}$.

28. The improvement defined in claim 22, wherein the wave transmission characteristics of said wave-transmitting medium is dependent upon the electric charge distribution in the vicinity of the wave-transmitting medium and wherein said apparatus further comprises means for varying the electric charge distribution profile.

29. The improvement defined in claim 22, wherein said guided waves are formed of electromagnetic radiation and wherein said wave-transmitting medium comprises a semiconductor material capable of absorbing said electromagnetic radiation.

30. The improvement defined in claim 22, wherein said wave-transmitting medium is capable of spontaneous and stimulated emission of electromagnetic radiation and wherein said apparatus further includes means for generating electrical carriers within said wave-transmitting medium, thereby generating said electromagnetic radiation.

* * * * *